United States Patent
Yamazaki et al.

(10) Patent No.: US 6,331,718 B1
(45) Date of Patent: *Dec. 18, 2001

(54) THIN FILM CIRCUIT WITH IMPROVED CARRIER MOBILITY

(75) Inventors: Shunpei Yamazaki, Tokyo; Jun Koyama; Hisashi Ohtani, both of Kanagawa, all of (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/998,791

(22) Filed: Dec. 29, 1997

(30) Foreign Application Priority Data

Dec. 30, 1996 (JP) .................................................... 8-358957

(51) Int. Cl.[7] ............................ H01L 27/092; H01L 27/12
(52) U.S. Cl. ................................ 257/64; 257/65; 257/66; 257/75
(58) Field of Search ................................. 257/64, 65, 66, 257/75

(56) References Cited

U.S. PATENT DOCUMENTS

| | | | |
|---|---|---|---|
| 5,403,772 | * 4/1995 | Zhang et al. | 437/101 |
| 5,433,168 | * 7/1995 | Yonehara | 117/90 |
| 5,488,000 | * 1/1996 | Zhang et al. | 437/21 |
| 5,589,847 | * 12/1996 | Lewis | 345/98 |
| 5,614,426 | * 3/1997 | Funada et al. | 437/40 |
| 5,619,044 | * 4/1997 | Makita et al. | 257/64 |
| 5,624,873 | * 4/1997 | Fonash et al. | 438/487 |
| 5,654,811 | * 8/1997 | Spitzer et al. | 349/106 |
| 5,696,388 | * 12/1997 | Funada et al. | 257/64 |
| 5,837,569 | * 11/1998 | Makita et al. | 438/166 |
| 5,882,960 | * 3/1999 | Zhang et al. | 438/166 |

FOREIGN PATENT DOCUMENTS

| | | |
|---|---|---|
| 4-154312 | 5/1992 | (JP) . |
| 7-249779 | 9/1995 | (JP) . |
| 7-335905 | 12/1995 | (JP) . |
| 8-288522 | 11/1996 | (JP) . |

OTHER PUBLICATIONS

Ng, Complete Guide to Semiconductor Devices, pp. 165–174, 1995.*

Sze, S. M., The Physics of Semiconductor Devices, 2nd ed., pp 849, 851, 1981.*

* cited by examiner

Primary Examiner—Eddie Lee
Assistant Examiner—Bradley Wm. Baumeister
(74) Attorney, Agent, or Firm—Fish & Richardson P.C.

(57) ABSTRACT

A practical operational amplifier circuit is formed using thin film transistors.

An operational amplifier circuit is formed by thin film transistors formed on a quartz substrate wherein 90% or more of n-channel type thin film transistors have mobility at a value of 260 cm$^2$/Vs or more and wherein 90% or more of p-channel type thin film transistors have mobility at a value of 150 cm$^2$/Vs or more. The thin film transistors have active layers formed using a crystalline silicon film fabricated using a metal element that promoted crystallization of silicon. The crystalline silicon film is a collection of a multiplicity of elongate crystal structures extending in a certain direction, and the above-described characteristics can be achieved by matching the extending direction and the moving direction of carriers.

30 Claims, 6 Drawing Sheets

THIN FILM CIRCUIT WITH IMPROVED CARRIER MOBILITY

BACKGROUND OF THE INVENTION

1. Field of the Invention

The present invention relates to a semiconductor circuit utilizing a crystalline silicon film formed on a quartz substrate or the like and, more particularly, to a semiconductor circuit having the function of an operational amplifier.

2. Description of the Related Art

Recently, research is being carried out on techniques for forming semiconductor devices utilizing a crystalline silicon film on a quartz substrate in an integrated manner. A typical example of such techniques is a technique for providing an active matrix circuit and a peripheral driving circuit for driving the same circuit on a single quartz substrate or glass substrate.

The required circuit configurations include active matrix circuits, shift register circuits and buffer circuits.

An active layer of a thin film transistor forming a part of a circuit is formed using a crystalline silicon film. A crystalline silicon film can be fabricated by forming an amorphous silicon film on a substrate and then heating it or irradiating it with laser beams or performing both to anneal it.

A thin film transistor having an active layer formed by a crystalline silicon film has better characteristics, such as mobility, than those having an active layer formed by an amorphous silicon film.

There is a need for higher levels of integration and higher performance also for circuits formed using thin film transistors.

Recently, it is contemplated to use thin film transistors to configure, on a substrate, not only logic circuits such as shift registers but also circuits having computing functions such as operational amplifiers which have conventionally been externally attached to a substrate.

Operational amplifier circuits have been generally configured using a single crystal silicon wafer.

An operational amplifier is basically comprised of a differential amplifier circuit. A differential amplifier circuit is formed by combining two transistors having similar characteristics.

In the case of a differential amplifier circuit, a change in temperature or power supply voltage affect the two transistors simultaneously. Therefore, a change in temperature or power supply voltage does not affect the output of the circuit.

In order for this to occur, the two transistors forming the differential amplifier circuit must have similar characteristics.

In practice, since it is difficult to provide two transistors having completely identical characteristics, efforts are being made toward manufacturing techniques to provide transistors that are as similar to each other as possible in their characteristics.

Thin film transistors utilizing a crystalline silicon film have mobility lower than that of MOS transistors fabricated using a single crystal silicon wafer. Further, they have a higher level of variation in characteristics.

For this reason, it has been difficult in practice to form an operational amplifier circuit using such thin film transistors.

The present invention solves this problem. Specifically, it is an object of the invention to form a practical operational amplifier circuit using thin film transistors.

SUMMARY OF THE INVENTION

According to an aspect of the invention, there is provided a group of operational amplifier circuits constituted by thin film transistors formed on an insulating surface characterized in that:

the operational amplifier circuits comprise a combination of at least n-channel type thin film transistors and p-channel type thin film transistors;

cumulative distribution of mobilities of the n-channel type thin film transistors becomes 90% or more at 260 $cm^2/Vs$; and cumulative distribution of mobilities of the p-channel type thin film transistors becomes 90% or more at 150 $cm^2/Vs$.

The above-described structure is formed on an insulating substrate represented by a quartz substrate. The use of a substrate having insulating properties makes it possible to configure a circuit suitable for operations at high speeds because it eliminates effects of capacitance of a substrate.

According to another aspect of the invention, an active layer of a thin film transistor is formed by a crystalline silicon film having a structure in which a multiplicity of columnar crystal structures extend in a direction that matches the moving direction of carriers.

According to the invention, since a thin film semiconductor is used for the active layer, the source and drain regions can be activated (after doping) by irradiating them with laser beams or intense beams.

This allows the use of aluminum which is a low-resistance material or a material mainly composed of aluminum for the gate electrode to improve adaptability to high speed operations.

Further, since the unique crystal structure suppresses the short-channel effect, predetermined operational performance can be achieved with dimensions larger than dimensions indicated by conventional scaling rules.

For example, when the above-described crystalline silicon film is used, a gate insulation film having a thickness on the order of 500 Å provides characteristics that have been available with only a gate insulation film having a thickness on the order of 200 Å according to conventional scaling rules.

It is technically and economically difficult to form a thin gate insulation film having preferable interface characteristics, no pin hole and a high withstand voltage over a large surface area.

From this point of view, it is advantageous to achieve predetermined characteristics free of limitations placed by conventional scaling rules.

In addition, the average S-value of thin film transistors utilizing a crystalline silicon film having the above-described unique crystal structure can be 100 mV/dec or less for either of p- and n-channel type thin film transistors even when a multiplicity of the same are formed on a substrate.

The S-value of a TFT fabricated using a general high temperature process (a general term that refers to processes for fabricating a TFT on a quartz substrate using an annealing step at about 1000° C.) is about 200 mV/dec or more when it is an n-channel type TFT and about 350 mV/dec or more when it is a p-channel type TFT.

The S-value of a TFT fabricated using a low temperature process (a general term that refers to processes for fabricating a TFT on a quartz substrate using a laser annealing step) is worse than that of a TFT fabricated using a high temperature process.

According to another aspect of the invention, there is provided a group of operational amplifier circuits constituted by thin film transistors formed on an insulating surface characterized in that:

the operational amplifier circuits comprise a combination of at least n-channel type thin film transistors and p-channel type thin film transistors; and active layers of the thin film transistors comprise a crystalline silicon film having a structure wherein a multiplicity of columnar crystal structures extend in a direction that matches the moving direction of carriers.

DETAILED DESCRIPTION OF PREFERRED EMBODIMENT

An active layer is formed by a crystalline silicon film having a structure with a multiplicity of crystal structures extending in a certain direction arranged in parallel. The direction in which the crystal structures extend is aligned with the direction of the moving direction of carriers. This makes it possible to obtain advantages that can not be achieved by conventional devices utilizing single crystal semiconductors and polycrystalline semiconductors.

The short channel effect is less likely to occur on such a crystalline silicon film formed by a multiplicity of crystal structures extending in the form of columns in a certain direction even if the dimension of a channel is reduced because the movement of carriers is regulated in the direction in which they extend.

The reason is based on the presence of a multiplicity of elongate and substantially monocrystalline regions (columnar regions) extending in parallel in the channel region. These suppress the expansion of a depletion layer in the channel between the source and drain regions.

In normal IC processing, efforts toward a finer structure result in a significant short channel effect. Measures must be taken to dope or diffuse impurities in the vicinity of a channel in order to suppress this short-channel effect. This results in a very complicated structure and increases technical and economical difficulties.

However, a crystalline silicon film having a unique crystal structure as described above suppresses the short channel effect using a simpler structure because of the uniqueness of the crystal structure of itself.

Figure 5:
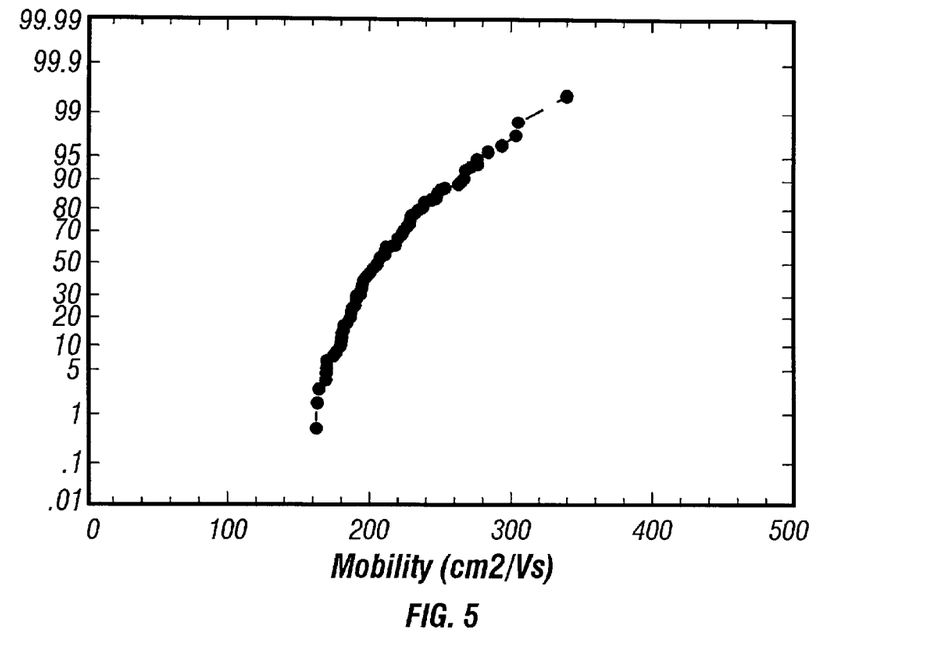
FIG. 5 illustrates the distribution of mobility of n-channel type thin film transistors integrated on the same substrate.
Figure 6:
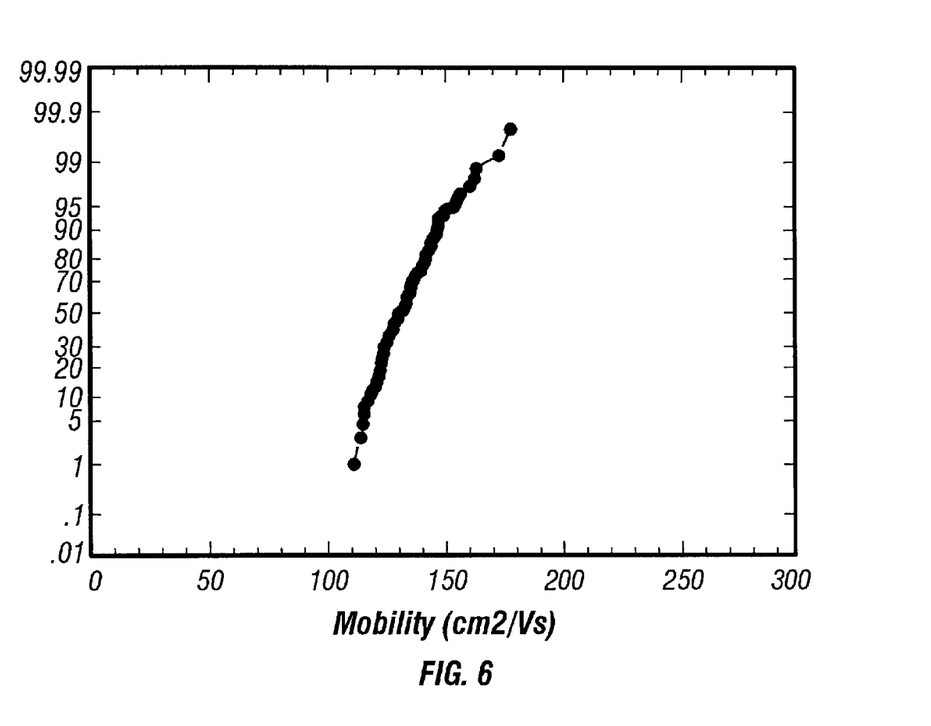
FIG. 6 illustrates the distribution of mobility of p-channel type thin film transistors integrated on the same substrate.
Figure 7:
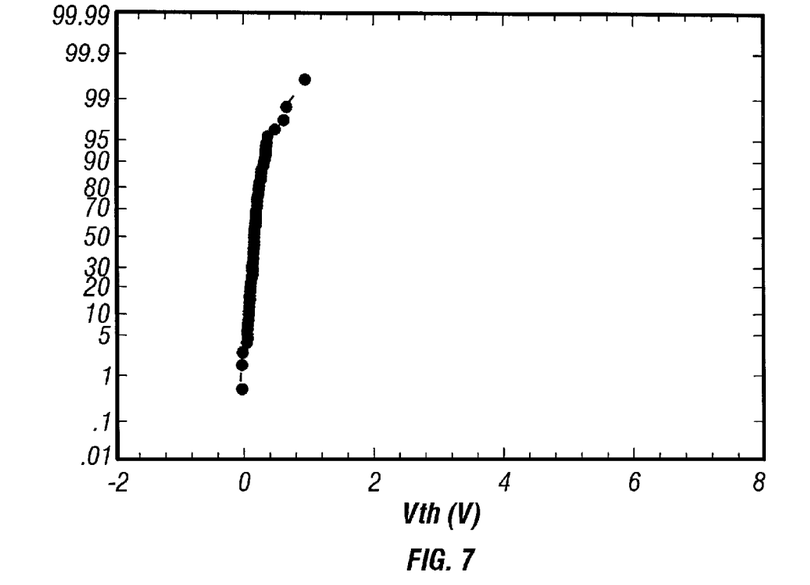
FIG. 7 illustrates the distribution of thresholds of n-channel type thin film transistors integrated on the same substrate.

Thin film transistors obtained using the same can be free of variation in characteristics in a plane of the substrate as shown in FIGS. 5 through 7.

Meanwhile, crystalline silicon films provided on a glass substrate or quartz substrate using a conventional high temperature process or low temperature process have had the so-called polycrystalline structure which is an aggregation of a multiplicity of crystal grains (particularly those having no anisotropism).

In this case, it becomes more difficult to control the state of crystal interfaces (particularly, the direction in which they extend and the quantity thereof) present in a channel as the device structure becomes finer.

Specifically, the quantity and direction of crystal interfaces that exist in a channel vary from device to device with decreasing size of the channel, which results in variation in device characteristics.

However, crystalline silicon films obtained according to the method shown in FIGS. 8A through 8D have crystal grain boundaries aligned in terms of the direction thereof and have widths which are constant to some degree within a dimension of about 0.2 $\mu$m or less. Therefore, they are less likely to cause variation of characteristics from device to device due to the presence of the crystal grain boundaries when the moving direction of carriers (especially in channels) is matched with the direction in which the crystal interfaces extend.

The reason is that the state of the crystal structure in the channel region is similar in every device.

Figure 1:
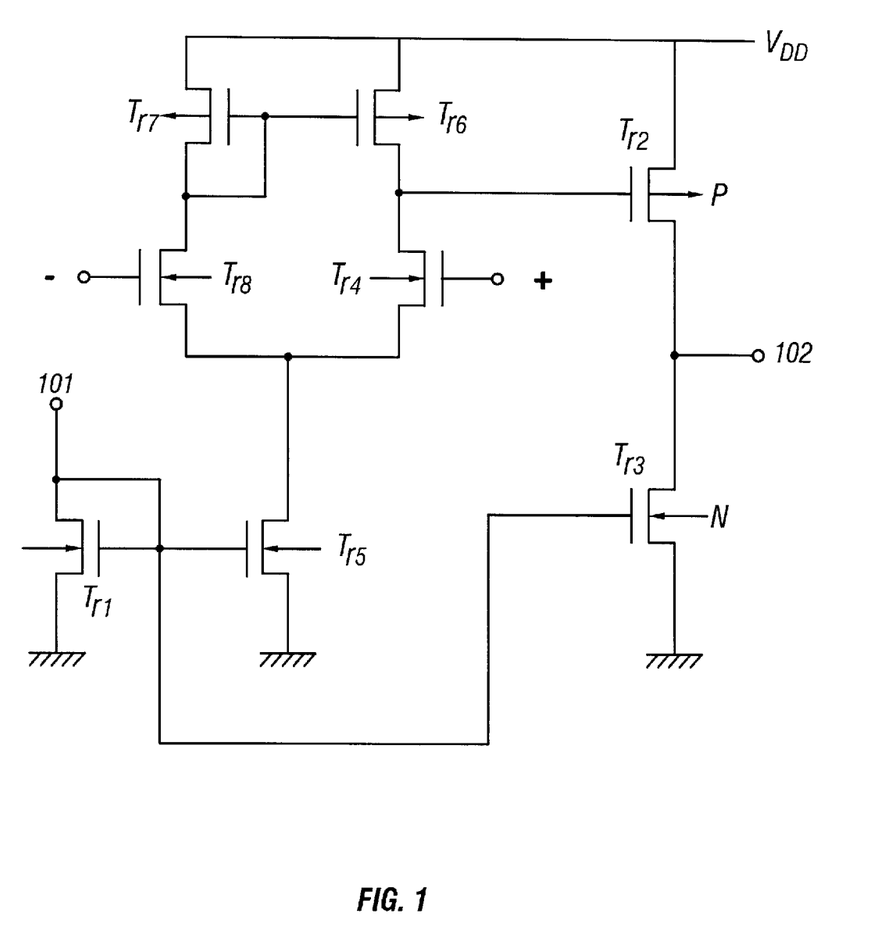
FIG. 1 is a diagram showing an equivalent circuit of an operational amplifier.
Figure 2:
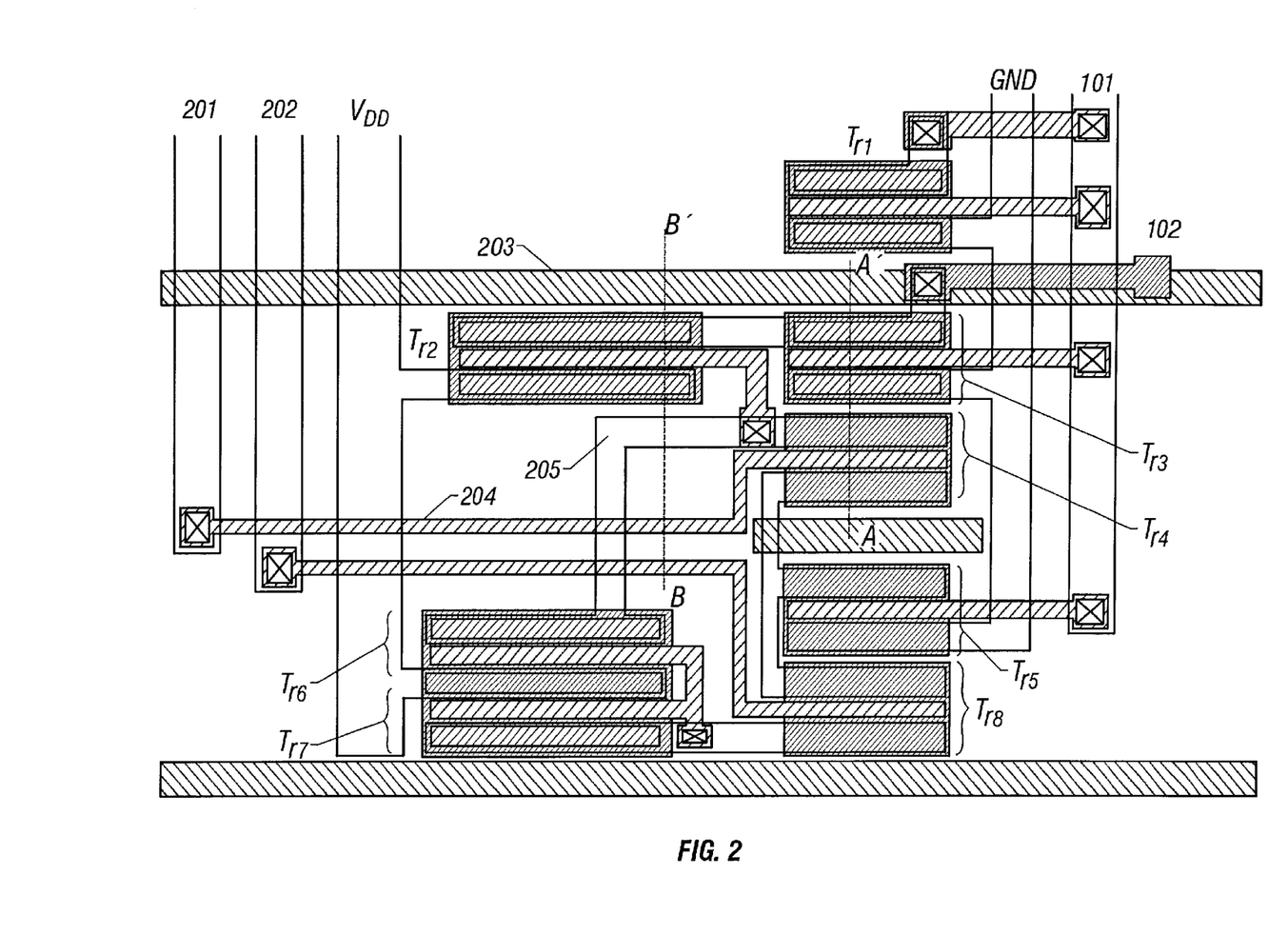
FIG. 2 illustrates the arrangement of patterns on an operational amplifier constituted by thin film transistors formed on a quartz substrate.

FIG. 1 shows an internal equivalent circuit of an operational amplifier formed by thin film transistors according to the present embodiment. FIG. 2 shows a mask pattern for the operational amplifier circuit represented by the equivalent circuit in FIG. 1. 201 designates a positive input. 202 designates a negative input. 203 designates a nickel-added region. 204 designates wiring on a first layer. 205 designates wiring on a second layer.

Figure 3:
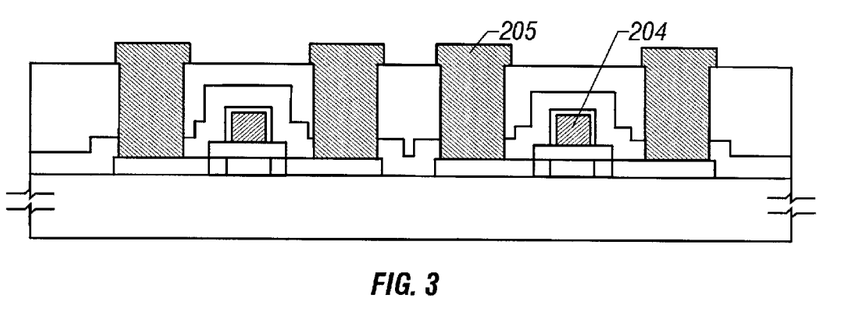
FIG. 3 is a sectional view taken along the line A—A in FIG. 2.
Figure 4:
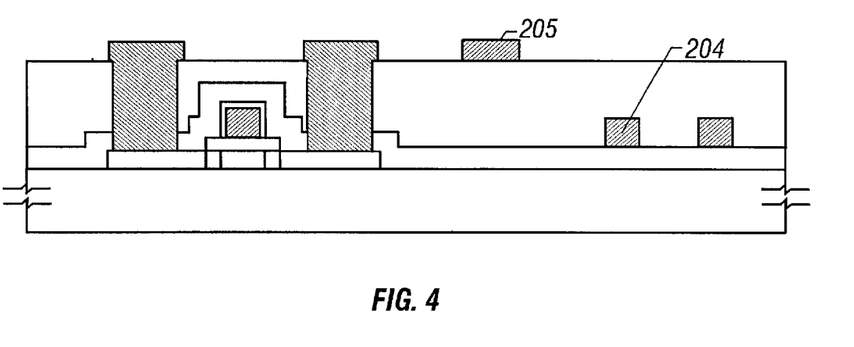
FIG. 4 is a sectional view taken along the line B—B in FIG. 2.

FIG. 3 shows a sectional view taken along the line A—A in FIG. 2. FIG. 4 shows a sectional view taken along the line B—B in FIG. 2.

In this embodiment, nickel is introduced into the elongate region specified as the nickel-added region to cause crystallization of an amorphous silicon film to start there, thereby forming thin film transistors using this region.

In the circuit configuration shown in FIG. 1, it is important that transistors $Tr_8$ and $Tr_4$ forming a differential circuit at the input portion have similar characteristics. 101 designates bias, and 102 designates output.

This embodiment has a pattern arrangement such that active layers forming the transistors $Tr_8$ and $Tr_4$ are arranged in positions at the same distance from the nickel-added region. This suppresses variation in characteristics that otherwise occurs due to a difference in the distance of crystal growth.

Referring to active layers forming transistors $Tr_6$ and $Tr_7$, the active layers are formed in positions at different distances of crystal growth (distances from the nickel-added region) because they are formed utilizing crystal growth from the same nickel-added region. This can result in a very slight difference in characteristics between the transistors $Tr_6$ and $Tr_7$. Such a difference in characteristics between the two transistors will not create any serious problem in this circuit configuration.

In this embodiment, thin film transistors having the cumulative distribution of characteristics in a plane of the substrate as shown in FIGS. 5 through 7 are utilized.

While the characteristics of a single thin film transistor alone have been a matter of concern in the prior art, in the case of a configuration of an operational amplifier circuit as shown in FIG. 1, what is important is characteristics on a collective basis (in other words, the distribution of characteristics or the distribution of variation in characteristics).

The thin film transistors are formed on a quartz substrate according to a method of fabrication to be described later.

FIG. 5 shows the cumulative distribution of mobility of n-channel type thin film transistors. FIG. 6 shows the cumulative distribution of mobility of p-channel type thin film transistors. FIG. 7 shows the cumulative distribution of $V_{th}$ (threshold voltages) of the n-channel thin film transistors.

FIGS. 5 through 7 show variation in the characteristics of TFTs on a single substrate. The ordinate axes of FIGS. 5 through 7 indicate ratios of presence in terms of percentage. The TFTs have a single gate structure fabricated according the method of fabrication to be described later wherein the channel length is 8 μm and the channel width is 8 μm.

FIG. 5 shows that cumulative distribution of mobilities of the n-channel type thin film transistors becomes 90% or more at 260 cm$^2$/Vs.

FIG. 6 shows that cumulative distribution of mobilities of the p-channel type thin film transistors becomes 90% or more at 150 cm$^2$/Vs.

The above description means that 90 TFTs or more out of 100 TFTs which have been arbitrarily selected have the a cumulative mobility as described above on average.

When an integrated circuit such as an operational amplifier is configured, it is important to use a group of elements having small variation in characteristics as shown in FIGS. 5 through 7.

For example, variation of $V_{th}$ (threshold voltage) is an important consideration when using a power supply voltage for driving of 5 V or 3.3 V or 1.5 V which will be more frequently used in the future.

FIGS. 8A through 8D schematically show steps for fabricating thin film transistors used in an operational amplifier circuit having a pattern arrangement as shown in FIG. 2.

Figure 8A:
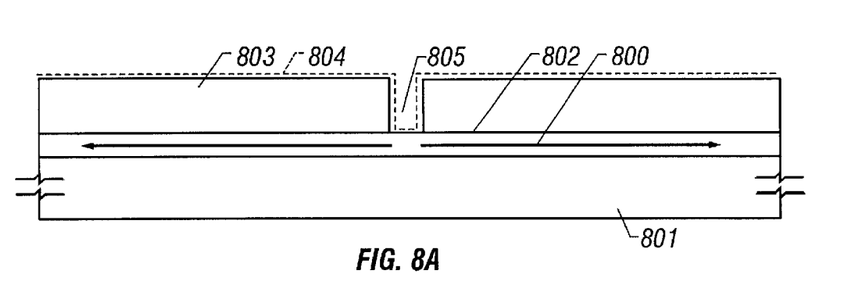
FIGS. 8A through 8D illustrate steps for fabricating thin film transistors.

First, an amorphous silicon film 802 is formed on a quartz substrate 801 to a thickness of 500 Å using low pressure thermal CVD. It is important that the quartz substrate used has a sufficiently smooth surface.

The thickness of the amorphous silicon film is preferably in the range from about 100 Å to about 1000 Å. The reason is that the thickness of an active layer is suppressed to some degree in order to achieve an annealing effect by irradiation with laser beams performed at a subsequent step of activating source and drain regions.

After the amorphous silicon film 802 is formed, a mask indicated by 803 is formed by a silicon oxide film which is formed using plasma CVD. This mask is formed with a hole indicated by 805 to provide a structure wherein the amorphous silicon film 802 is exposed in this region.

The hole 805 extends in the direction perpendicular to the plane of the drawing (this hole corresponds to the nickel-added region 203 in FIG. 2).

After the mask 803 is formed, a solution of nickel acetate containing nickel of 10 ppm by weight is applied using spin coating. Thus, a state as indicated by 804 is realized wherein nickel is retained in contact with the surface (FIG. 8A).

While a method of introducing nickel utilizing a solution has been described here, nickel may be introduced on to the surface of the amorphous silicon film using methods such as CVD, sputtering, plasma processing and gas adsorption.

Further, nickel can be introduced in a more accurately controlled quantity and position using a method-based ion implantation.

Instead of nickel, an element selected from among Fe, Co, Ru, Rh, Pd, Os, Ir, Pt, Cu and Au may be used. Such elements have a function of promoting crystallization of silicon.

Next, a heating process is performed in a nitrogen atmosphere for eight hours at 600° C. At this step, crystal growth proceeds in a direction in parallel with the substrate as indicated by 800.

After the crystallization achieved by this heating process, there are defects in the film in a high density and the uniqueness of the crystal structure to be detailed below is still insignificant (FIG. 8A).

The above-described heating process may be performed within a temperature range from 450° C. to the temperature that the substrate can withstand (about 1100° C. in the case of a quartz substrate).

Next, the mask 803 is removed. A heating process is then performed for 20 minutes at 950° C. in an oxygen atmosphere containing 3% HCl by volume. This step forms a thermal oxidation film having a thickness of 200 Å on the surface of the silicon film. The thickness of the silicon film is reduced to 400 Å at this step.

This step of heating process is important. This step of heating process anneals the crystalline silicon film and removes nickel from the film. This heating process provides a unique crystalline silicon film formed by a multiplicity of columnar crystal structures extending in a certain direction in the form of columns having widths in the range from about 0.5 μm to about 2 μm.

The formation of the thermal oxidation film provides two effects. One of the effects is a reduction of nickel in the silicon film as a result of absorption of nickel into the thermal oxidation film.

The other is an effect wherein silicon atoms which have been redundant or unstably bonded are consumed as the thermal oxidation film is formed to reduce defects greatly and consequently to improve crystallinity.

Then, the thermal oxidation film thus formed is removed. Since this thermal oxidation film contains nickel in a relatively high density, the removal of the thermal oxidation film makes it possible to eventually prevent nickel from adversely affecting the device characteristics.

Figure 8B:
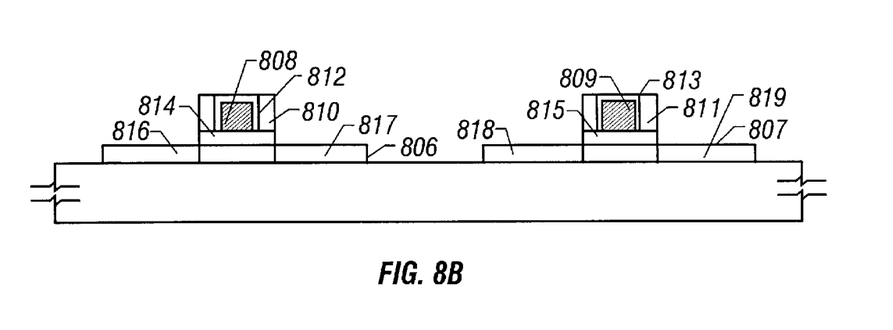

When the 400 Å thick silicon film is thus obtained, it is patterned to form active layers of thin film transistors. FIG. 8B shows active layers indicated by 806 and 807.

It is important here to set the direction in which the sources and drains are connected or the moving direction of carriers in the channels such that it matches the direction of the above-described direction of crystal growth (which coincides with the direction in which the above-described columnar crystal structures extend).

In FIG. 8B, 806 designates an active layer of a p-channel type thin film transistor, and 807 designates an active layer of an n-channel type thin film transistor.

Although steps for fabricating only two thin film transistors are illustrated here, in practice, a multiplicity of nickel-added regions as illustrated in FIG. 2 are provided on the substrate to form a multiplicity of thin film transistors simultaneously After the active layers are formed, plasma CVD is performed to form a silicon oxide film having a thickness of 300 Å which is to serve as a part of a gate insulation film. Further, the second thermal oxidation is carried out in an oxygen atmosphere containing 3% HCl by volume to form a thermal oxidation film to a thickness of 300 Å. This provides a gate insulation film having a thickness of 600 Å consisting of the CVD-oxidated silicon film and the thermal oxidation film. As a result of this second formation of a thermal oxidation film, the thickness of the active layers is reduced to 250 Å.

Next, gate electrodes 808 and 809 made of aluminum are formed. After the gate electrodes are formed, anodization is carried out to first form porous anodic oxide films 810 and 811. Further, the second anodization is carried out to form anodic oxide films 812 and 813 having denser film properties. The difference in the properties of the anodic oxide films may be selected depending on the type of electrolyte used.

Next, the exposed gate insulation film is removed. FIG. 8B shows gate insulation films 814 and 815 left thereon.

In this state, doping for providing conductivity types is carried out using plasma doping. Here, doping of B (boron) is carried out first with the region to become an n-channel type thin film transistor masked with a resist mask. Then, doping of P (phosphorus) is carried out with the region to become a p-channel type thin film transistor masked with a resist mask.

The doping at this step is performed under conditions for forming source and drain regions. At this step, a source region 816 and a drain region 817 of a p-channel type TFT and a source region 819 and a drain region 818 of an n-channel type TFT are formed on a self-alignment basis.

Thus, the state shown in FIG. 8B is formed. Next, the porous anodic oxide films 810 and 811 are removed.

Figure 8C:
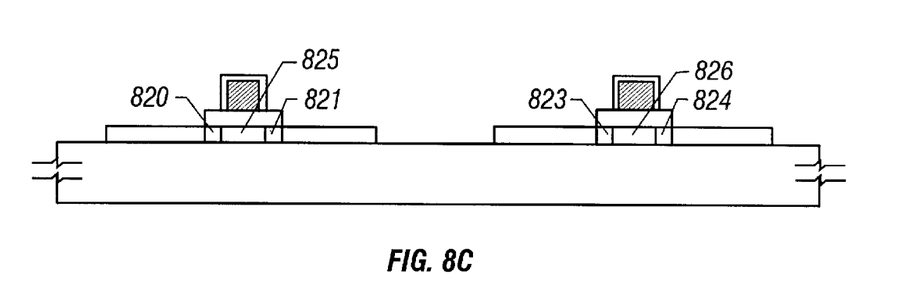

Next, the second doping is carried out under conditions for light doping. At this step, low density impurity regions 820, 821, 823 and 824 are formed on a self-alignment basis. Further, channel formation regions 825 and 826 are formed on a self-alignment basis.

The low density impurity regions toward the drain regions become regions referred to as LDDs (lightly doped drains).

After the doping, laser beams are projected to activate the doped elements and to anneal damage on the active layers caused by the doping. This step may be performed using methods that employ irradiation with ultraviolet beams and infrared beams.

Figure 8D:
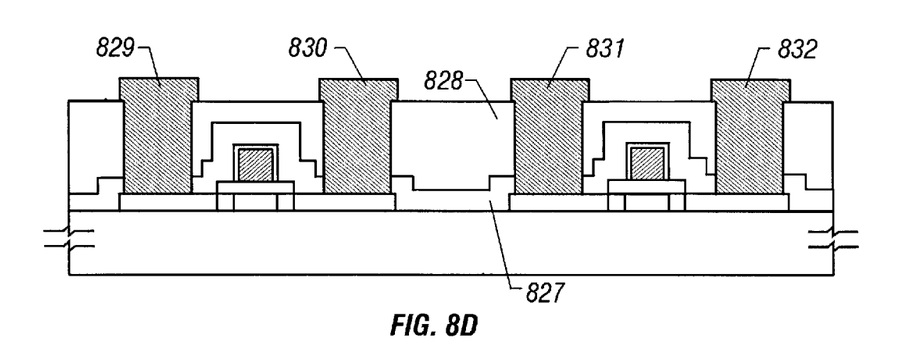

Next, a silicon nitride film 827 as a layer insulation film is formed using plasma CVD to a thickness of 1500 Å, and a layer insulation film 828 made of polyimide resin is further formed. The use of resin for the layer insulation film allows the surface thereof to be planarized.

In addition to polyimide resin, it is possible to use polyamide resin, polyimideamide resin, acrylic resin, epoxy resin or the like.

Next, contact holes are formed to form a source electrode (and source wiring) 829 and a drain electrode (and drain wiring) 830 of the p-channel type TFT. Further, a source electrode (and source wiring) 832 and a drain electrode (and drain wiring) 831 of the n-channel type TFT are formed.

There is thus provided a configuration wherein a p-channel type thin film transistor and an n-channel type thin film transistor are integrated.

According to the fabrication steps described here, it is possible to provide thin film transistors having excellent characteristics as shown in FIGS. 5 through 7 with less variation of characteristics by using a set of a multiplicity of columnar crystal structures extending in parallel in a certain direction as active layers.

Referring further to the characteristics, both of p- and n-channel type thin film transistors can be provided with S-values of 100 mV/dec or less on average.

The use of such thin film transistors makes it possible to configure an operational amplifier circuit as shown in FIGS. 1 and 2.

Figure 9:
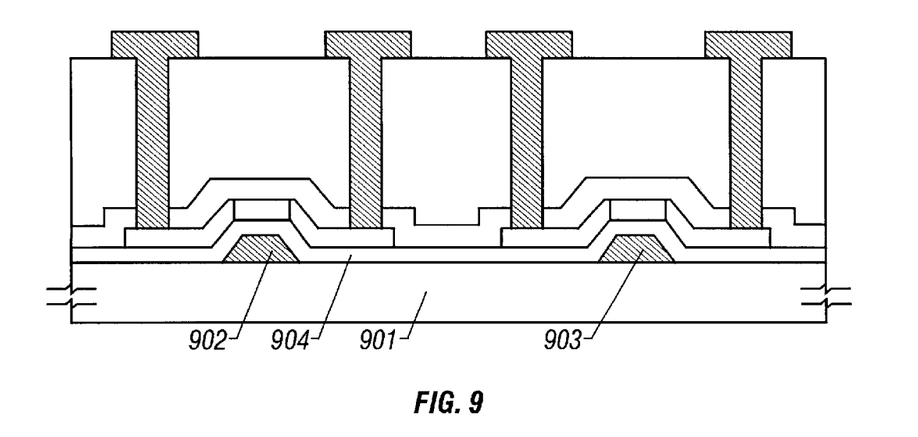
FIG. 9 illustrates a schematic configuration of bottom-gate type thin film transistors.

FIG. 9 shows another form of thin film transistors to which the present invention can be applied.

The thin film transistor shown in FIG. 9 is a bottom gate type thin film transistor and has a structure in which gate electrodes 902 and 903 are formed on a quartz substrate 901; a gate insulation film 904 is further formed; and an active layer is formed thereon.

In the configuration shown in FIG. 9, the active layer must be formed after forming the gate electrodes and gate insulation film. Therefore, the active layer is formed in accordance with the above-described steps for fabricating thin film transistors shown in FIG. 8 after the gate insulation film is formed.

The steps for fabricating thin film transistors shown in FIGS. 8A through 8D represent an example wherein aluminum is used for gate electrodes. Tantalum may be used instead of aluminum. Tantalum can also be anodized and can be used for fabrication of thin film transistors according to the fabrication steps shown in FIGS. 8A through 8D.

Further, polysilicon and silicide having conductivity types can be used for gate electrodes. In this case, however, it is not possible to obtain the advantage of low resistance which is available when aluminum is used.

The use of present invention makes it possible to fabricate a practical operational amplifier circuit using thin film transistors.

Although the present invention and its advantages have been described in detail, it should be understood that various changes, substitutions and alterations can be made herein without departing from the spirit and scope of the invention as defined by the appended claims.

What is claimed is:

1. A semiconductor device which has a group of operational amplifier circuits formed on an insulating surface:
    said operational amplifier circuits comprising a combination of at least n-channel type thin film transistors and p-channel type thin film transistors;
    wherein cumulative distribution of mobilities of said n-channel type thin film transistors becomes 90% or more at 260 cm$^2$/Vs; and
    wherein cumulative distribution of mobilities of said p-channel type thin film transistors becomes 90% or more at 150 cm$^2$/Vs.

2. A circuit according to claim 1, wherein said thin film transistors are formed on a quartz substrate.

3. A circuit according to claim 1, wherein an average S-value of said p- and n-channel type thin film transistors is 100 mV/decade or less.

4. The circuit of claim 1 wherein said n-channel type thin film transistors have source and drain regions doped with phosphorus.

5. The circuit of claim 1 wherein said p-channel type thin film transistors have source and drain regions doped with boron.

6. The circuit of claim 1 wherein said p-channel type thin film transistors and said n-channel type thin film transistors have channel lengths longer than lengths of lightly doped drains thereof.

7. The circuit of claim 6 wherein said channel lengths are 8 μm.

8. The thin film circuit of claim 1 wherein said n-channel type thin film transistors have respective low density impurity regions.

9. A semiconductor device which has a group of differential circuits formed on an insulating surface,
    said differential circuits comprising a combination of at least n-channel type thin film transistors and p-channel type thin film transistors;
    wherein cumulative distribution of mobilities of said n-channel type thin film transistors becomes 90% or more at 260 cm$^2$/Vs; and wherein cumulative distribution of mobilities of said p-channel type thin film transistors becomes 90% or more at 150 cm²/Vs.

10. The circuit of claim 9 wherein a part of said differential circuits constitutes an operational amplifier.

11. The circuit of claim 9 wherein said n-channel type thin film transistors have source and drain regions doped with phosphorous.

12. The circuit of claim 9 wherein said p-channel type thin film transistors have source and drain regions doped with boron.

13. The circuit of claim 9 wherein said p-channel type thin film transistors and said n-channel type thin film transistors have channel lengths longer than lengths of lightly doped drains thereof.

14. The circuit of claim 13 wherein said channel lengths are 8 μm.

15. The thin film circuit of claim 9 wherein said n-channel type thin film transistors have respective low density impurity regions.

16. A semiconductor device constituted by a group of operational amplifier circuits formed on an insulating surface,
said operational amplifier circuits comprising a combination of at least n-channel type thin film transistors and p-channel type thin film transistors;
wherein cumulative distribution of mobilities of said n-channel type thin film transistors becomes 90% or more at 260 cm²/Vs,
wherein cumulative distribution of mobilities of said p-channel type thin film transistors becomes 90% or more at 150 cm²/Vs, and
wherein active layers of said n-channel type and p-channel type thin film transistors have carriers therein and comprise a crystalline silicon film having a structure wherein a multiplicity of columnar crystal structures extend in a direction that matches a moving direction of said carriers.

17. The circuit of claim 16 wherein said columnar crystal structures have widths which are constant within a dimension of 0.2 μm or less.

18. The circuit of claim 16 wherein said n-channel type thin film transistors have source and drain regions doped with phosphorous.

19. The circuit of claim 16 wherein said p-channel type thin film transistors have source and drain regions doped with boron.

20. The circuit of claim 16 wherein said p-channel type thin film transistors and said n-channel type thin film transistors have channel lengths longer than lengths of lightly doped drains thereof.

21. The circuit of claim 20 wherein said channel lengths are 8 μm.

22. The thin film circuit of claim 16 wherein said n-channel type thin film transistors have respective low density impurity regions.

23. A semiconductor device constituted by a group of differential circuits formed on an insulating surface,
said differential circuits comprising a combination of at least n-channel type thin film transistors and p-channel type thin film transistors;
wherein cumulative distribution of mobilities of said n-channel type thin film transistors becomes 90% or more at 260 cm²/Vs; and
wherein cumulative distribution of mobilities of said p-channel type thin film transistors becomes 90% or more at 150 cm²/Vs, and
wherein an average S-value of said p- and n-channel type thin film transistors is 100 mV/decade or less.

24. The thin film circuit of claim 23 wherein said n-channel type thin film transistors have respective low density impurity regions.

25. A semiconductor device constituted by a group of differential circuits formed on an insulating surface,
said differential circuits comprising a combination of at least n-channel type thin film transistors and p-channel type thin film transistors;
wherein cumulative distribution of mobilities of said n-channel type thin film transistors becomes 90% or more at 260 cm²/Vs, and
wherein cumulative distribution of mobilities of said p-channel type thin film transistors becomes 90% or more at 150 cm²/Vs, and
wherein active layers of said n-channel type and p-channel type thin film transistors have carriers therein and comprise a crystalline silicon film having a structure wherein a multiplicity of columnar crystal structures extend in a direction that matches a moving direction of said carriers.

26. The thin film circuit of claim 25 wherein said n-channel type thin film transistors have respective low density impurity regions.

27. The thin film circuit of claim 25 wherein an average S-value of said n-channel type thin film transistors and said 100 p-channel type thin film transistors is mV/decade or less.

28. A semiconductor device which has a group of differential circuits formed on an insulating surface,
said differential circuits comprising a combination of at least n-channel type thin film transistors and p-channel type thin film transistors;
wherein cumulative distribution of mobilities of said n-channel type thin film transistors becomes 90% or more at 260 cm²/Vs, and
wherein cumulative distribution of mobilities of said p-channel type thin film transistors becomes 90% or more at 150 cm²/Vs,
wherein active layers of said n-channel type and p-channel type thin film transistors have carriers therein and comprise a crystalline silicon film having a structure wherein a multiplicity of columnar crystal structures extend in a direction that matches a moving direction of said carriers, and
wherein an average S-value of said p- and n-channel type thin film transistors is 100 mV/decade or less.

29. The thin film circuit of claim 28 wherein said n-channel type thin film transistors have respective low density impurity regions.

30. A semiconductor device which has a group of operational amplifier circuits formed over an insulating surface:
said operational amplifier circuits comprising a combination of at least n-channel type thin film transistors and p-channel type thin film transistors,
wherein cumulative distribution of mobilities of said n-channel type thin film transistors becomes 90% or more at 260 cm²/Vs, and
wherein cumulative distribution of mobilities of said p-channel type thin film transistors becomes 90% or more at 150 cm²/Vs, and
wherein an average S-value of said p- and n-channel type thin film transistors is 100 mV/decade or less.

* * * * *